(12) United States Patent
Mirzaei et al.

(10) Patent No.: US 8,855,593 B2
(45) Date of Patent: Oct. 7, 2014

(54) SAW-LESS RECEIVER WITH NOTCH AT TRANSMITTER FREQUENCY

(75) Inventors: Ahmad Mirzaei, San Diego, CA (US); Mohyee Mikhemar, Aliso Viejo, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 57 days.

(21) Appl. No.: 13/448,980

(22) Filed: Apr. 17, 2012

(65) Prior Publication Data

US 2013/0272349 A1    Oct. 17, 2013

(51) Int. Cl.
*H04B 1/10* (2006.01)

(52) U.S. Cl.
USPC .......................................... 455/307; 455/213

(58) Field of Classification Search
USPC .............................. 455/213, 307, 114.3, 115.1
See application file for complete search history.

(56) References Cited

U.S. PATENT DOCUMENTS

| | | | |
|---|---|---|---|
| 6,477,360 B1 * | 11/2002 | Watanabe et al. | 455/318 |
| 7,653,364 B2 * | 1/2010 | Mucke | 455/114.1 |
| 7,702,294 B2 * | 4/2010 | Granata | 455/78 |
| 7,983,625 B2 * | 7/2011 | Granata | 455/78 |
| 8,013,690 B2 * | 9/2011 | Miyashiro | 333/176 |
| 8,036,623 B2 * | 10/2011 | Chang et al. | 455/296 |
| 8,270,927 B2 | 9/2012 | Wallace et al. | |
| 8,526,903 B2 * | 9/2013 | Gudem et al. | 455/310 |
| 2008/0175307 A1 | 7/2008 | Brunn et al. | |
| 2010/0255791 A1 | 10/2010 | Vazny et al. | |
| 2011/0003572 A1 | 1/2011 | Mirzaei et al. | |

FOREIGN PATENT DOCUMENTS

WO    WO 2006/097799 A1    9/2006

OTHER PUBLICATIONS

European Search Report, App. No. 12008554.3, dated Apr. 24, 2014, 3 pages.

* cited by examiner

*Primary Examiner* — Sonny Trinh
(74) *Attorney, Agent, or Firm* — Brinks Gilson & Lione

(57) ABSTRACT

A circuit includes a local oscillator of a transmitter, the local oscillator to generate a transmitter local oscillator signal. A switch controlled by the transmitter local oscillator signal connects with a baseband impedance element to generate a notch frequency signal. The notch frequency signal is added to a transmitter leakage signal to attenuate the transmitter leakage signal prior to demodulation of a desired receiver signal by a receiver.

20 Claims, 6 Drawing Sheets

SAW-LESS RECEIVER WITH NOTCH AT TRANSMITTER FREQUENCY

TECHNICAL FIELD

This disclosure relates generally to communication systems and methods. More particularly, it relates to a SAW-less receiver with a notch at the transmitter frequency to attenuate transmitter leakage signal to the receiver.

BACKGROUND

A receiver includes an electronic device that receives radio waves and converts the information carried by them to a usable form. The receiver is used with an antenna that intercepts radio waves and converts them to alternating currents which are applied to the receiver. The receiver can extract desired information from the alternating currents. The information produced by the receiver may be in the form of sound, e.g., an audio signal, images, e.g., a video signal or data, e.g., a digital signal.

BRIEF DESCRIPTION OF THE DRAWINGS

The system may be better understood with reference to the following drawings and description. In the figures, like reference numerals designate corresponding parts throughout the different views.

DETAILED DESCRIPTION

A radio transmitter and receiver, e.g. of a transceiver, can operate concurrently in full duplex or other frequency division duplex (FDD) systems, e.g., 3G Wideband Code Division Multiple Access (WCDMA) and 4G Long Term Evolution (LTE). Due to a finite physical and/or electrical isolation between the receiver and transmitter a transmitter signal can leak to the receiver. The leaked transmitter signal can act to jam or block the receiver input to impose challenging linearity requirements on the receiver. The linearity requirements can require more power to meet them than if there were no leakage. Also, due to receiver local oscillator (RX-LO) phase noise, a strong blocker signal from the transmitter can be reciprocally down-converted on top of the desired signal in the baseband, which as a result, can impose tough phase-noise requirements on the RX-LO.

Challenging phase-noise requirements can lead to large power consumption in the receiver voltage-controlled oscillator (VCO) as well as in the receiver's local oscillator generator (LOGEN) blocks. The presence of the transmitter leakage signal can require a large receiver mixer second order input intercept point (IIP2). The large IIP2 can require large sized mixer switches, which can add to the LOGEN power dissipation. Therefore, in one implementation notch filtering controlled by the transmitter local oscillator (TX-LO) can be introduced in the receiver RF frontend prior to the down-conversion mixer, to attenuate the transmitter blocker. This attenuation technique can result in lower power dissipation in the RX-VCO and in the RX LOGEN.

Figure 1:
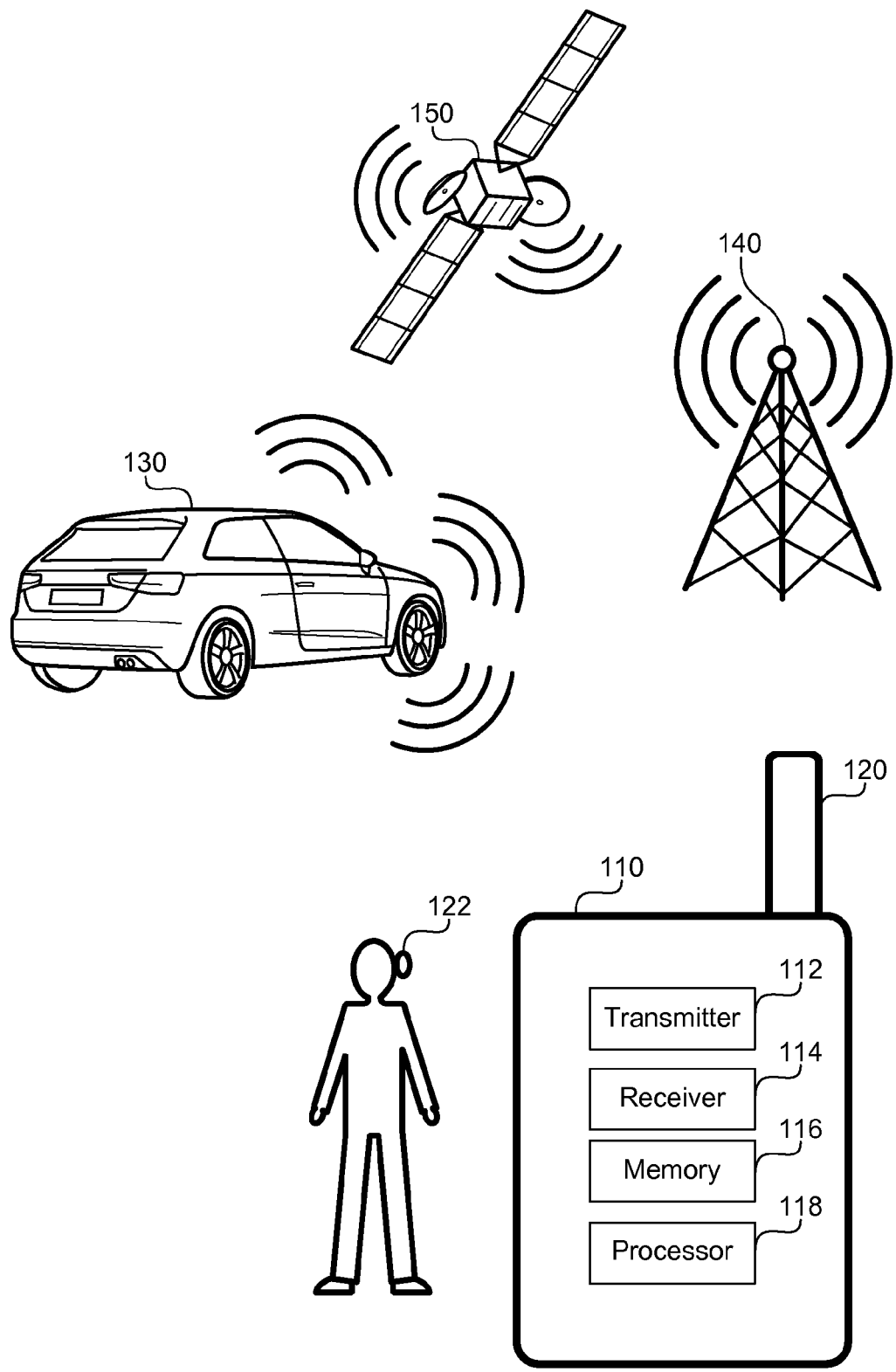
FIG. 1 is a block diagram of an exemplary communication environment.

FIG. 1 is a block diagram of an exemplary communication environment 100. Communication signals can be sent between endpoints. In one example, the endpoint is a communication device 110, such as a cell phone, personal digital assistant, tablet, portable email device, smartphone or a portable gaming system. The communication device can include a transmitter 112, a receiver 114, a memory 116, a processor 118 and an antenna 120 to wirelessly exchange information, e.g., emails, text messages, radio, music, television, videos, video games, digital information, etc., with other endpoints. The transmitter 112 and receiver 114 can be configured separately or together, such as in a transceiver. The communication device 110 may also wirelessly connect to a radio receiver or other audio device such as earpiece 122.

The communication environment 100 can also include other endpoints such as vehicles 130, such as automobiles, aircraft, ships and spacecraft. The communication environment 100 can also include devices to provide a communication link between the endpoints such as cellular towers 140 and satellites 150. Transmitters 112 can also be component parts of many electronic devices that communicate by radio, such as wireless computer networks, Bluetooth enabled devices, garage door openers, radar sets, and navigational beacons. The antenna 120 may be enclosed inside a case or attached to the outside of the transmitter 112 and receiver 114, as in portable devices such as cell phones, walkie-talkies, and auto keyless remotes.

Figure 2:
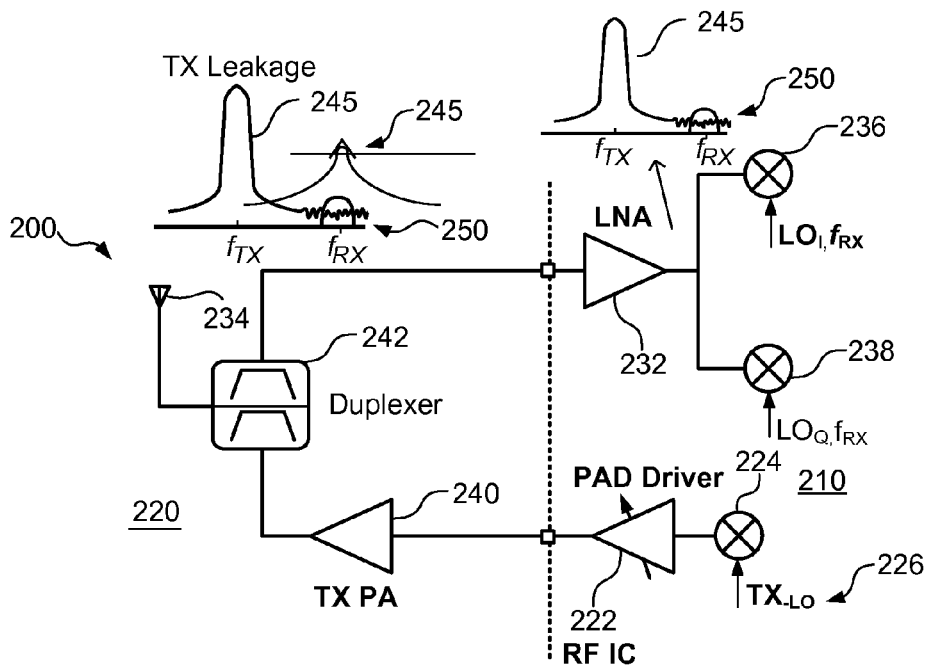
FIG. 2 is a circuit diagram of an exemplary full duplex transceiver.

FIG. 2 is a circuit diagram of an exemplary full duplex transceiver 200. The transceiver 200 can include a radio frequency integrated circuit (RFIC) 210 and an external circuit board 220. The RFIC 210 can include a power amplifier driver, e.g., PA driver 222 for transmitting communication signals. The PA driver 222 can receive modulated transmitter local oscillator signals from transmission mixer 224. The transmission mixer 224 can up-convert the modulated signal in the baseband to the transmitter local oscillator frequency (TX_LO) 226. The RFIC can also include a low noise amplifier (LNA) 232 for receiving communication signals and amplifying possibly weak communication signals received by antenna 234. The LNA 232 can connect to mixers 236 and 238 to demodulate received modulated signals, e.g., by using receiver local oscillator (LO) generated frequency signals 237 and 239 for the I and Q channels respectively.

In addition to the antenna 234, the external circuit board 220 can include a transmitter power amplifier 240 to amplify the signals being transmitted. The external circuit board 220 can also include duplexer 242 to simultaneously handle transmitted and received signals.

In WCDMA, the transmitter and receiver may be separated in the high-band by about 80 to 100 megahertz or in the low-band by about 45 megahertz. Without a surface acoustic wave (SAW) filter positioned between the duplexer 242 and the LNA 232, the LNA 232 may receive about −20 dBM of leakage from the transmitter power amplifier 240. In addition, the LO phase noise can reciprocally down convert leakage 246 on top of the desired signal, RX desired 250. Therefore, the LO signal may need to meet a high phase noise standard that does not cause it to affect RX desired 250 which can require about 20 milliamps of power in the VCO and local oscillator generator (LOGEN) blocks. The TX leakage can also create a need for a large receiver mixer IIP2, which can include large mixer switches or more power consumption for LOGEN to reduce phase noise, and strict calibration requirements.

Figure 3:
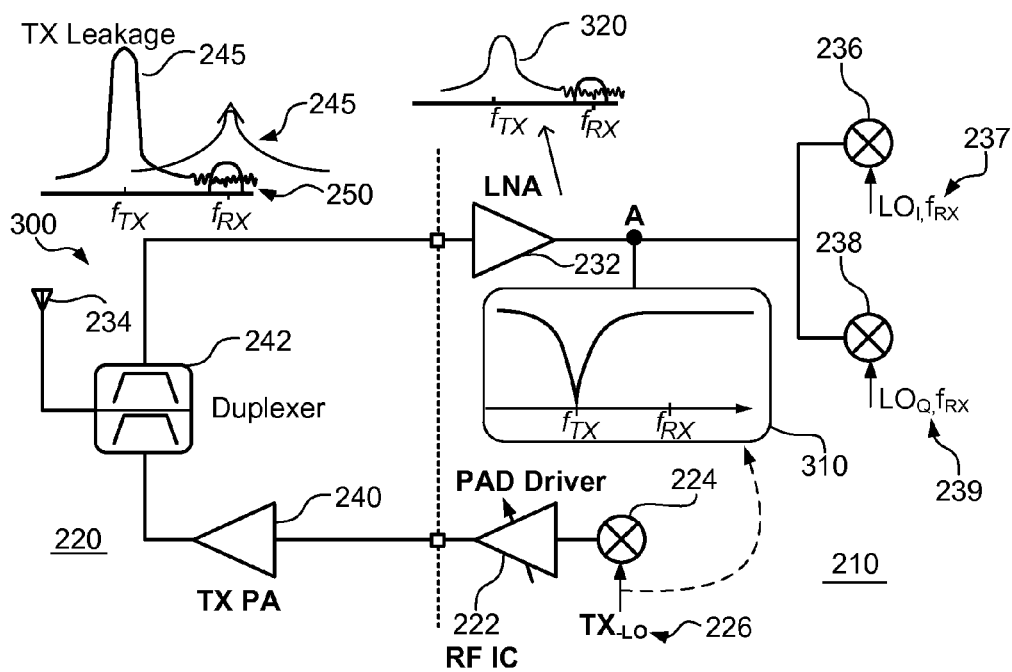
FIG. 3 is a circuit diagram of an exemplary full duplex transceiver.

FIG. 3 is a circuit diagram of an exemplary full duplex transceiver 300. A notch frequency signal fTX 310 can be generated at the transmitter frequency fTX, e.g., by using a clean transmission frequency signal from the transmitter local oscillator frequency (TX_LO) 226. To attenuate the TX leakage signal 245 the notch signal 310 can be inserted at point A in the circuit after the TX leakage signal 245 passes through the LNA 232 and before mixers 236 and 238. Therefore, the attenuated TX leakage signal 320 can avoid interfering with the desired receiver signal fRX prior to demodulation by the mixers 236 and 238 of the desired receiver signal fRX. Alternatively or additionally, the notch can be incorporated within the LNA 232 instead of being applied after the LNA 232. For 1 dB of attenuation the LO phase nose in the RX can be relaxed by about 1 dB. For example, about half of the VCO power of the receiver can be saved with as little as about 3 dB attenuation of the TX leakage 245. For 6 dB of attenuation of TX leakage 245, up to about four times power can be reduced in the receiver's VCO.

Additionally or alternatively, the attenuated TX leakage signal 245 can relax the IIP2 requirements. The relaxed IIP2 requirements for the down conversion mixers 236 and 238 can allow for physically smaller mixer switches which can result in less loading for LOGEN and therefore power consumption savings.

Figure 4:
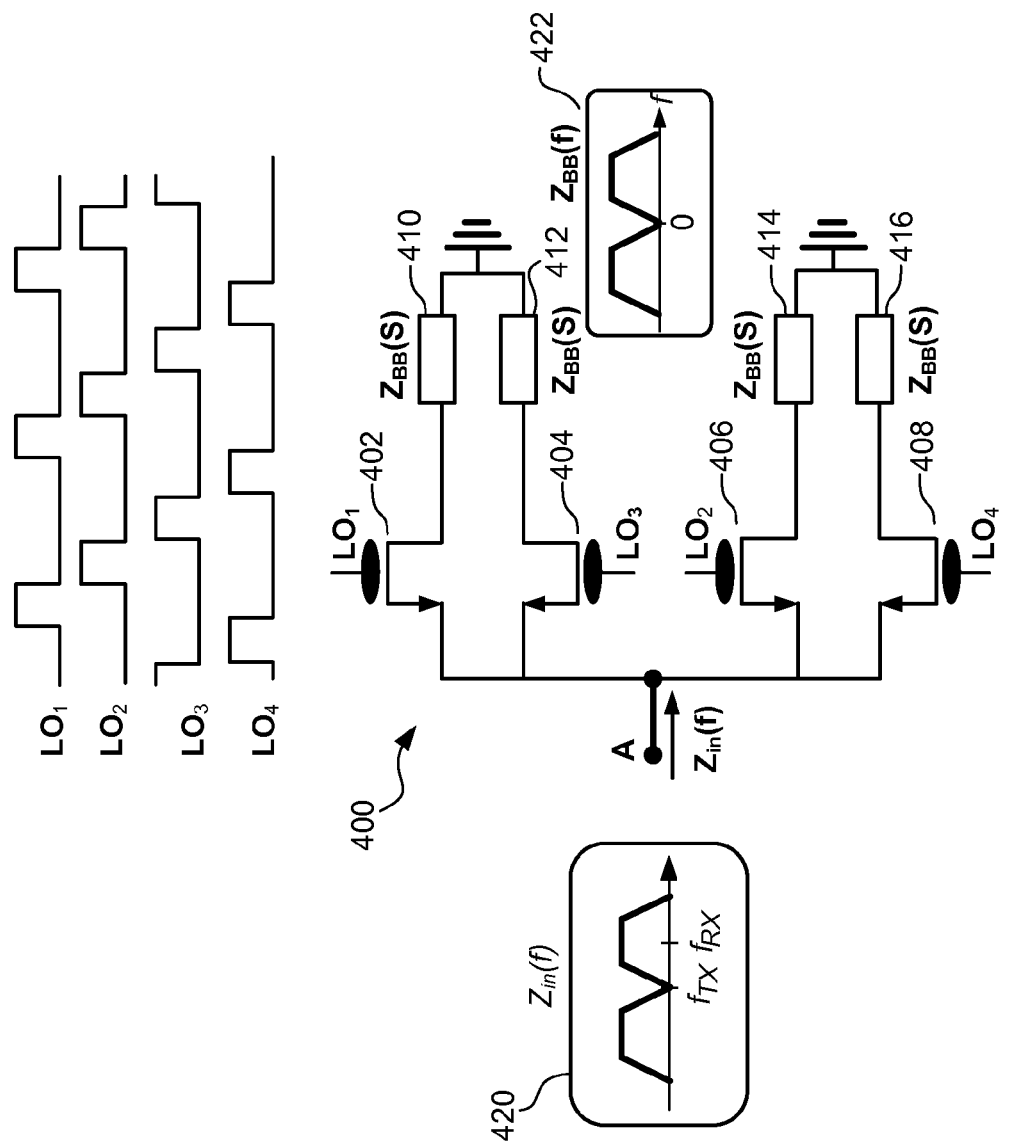
FIG. 4 is a circuit diagram of an exemplary notch circuit.

FIG. 4 is a circuit diagram of an exemplary notch filter circuit 400. The circuit can include switches 402, 404, 406 and 408 driven by local oscillators LO1, LO2, LO3 and LO4 with 25% duty cycle and phase delay similar to mixer LOs 236 and 238 for the I+, I−, Q+ ad Q− channels. The switches 402, 404, 406 and 408 can connect with impedances elements ZBB(s) 410, 412, 414 and 416, respectively. The filter notch can operate based on a frequency shifting or translation of a low-quality factor (Q) baseband impedance ZBB(f) 422 to obtain a high Q band pass filter notch Zin(f) 420.

Therefore, Zin(f) 420 can be generated from baseband impedance ZBB(f) 422, such as from impedance elements ZBB(s) 410, 412, 414 and 416. Zin(f) 420 can be frequency shifted to the radio frequency, e.g., by the frequency of the transmitter local oscillators LO1, LO2, LO3 and LO4. TX_LO can correspond to transmitter local oscillators LO1, LO2, LO3 and LO4 in FIG. 3. Therefore, on the radio frequency side a frequency notch signal can be generated at the frequency fTX and applied to point A in the circuit 400 to attenuate the TX leakage signal. The TX leakage signal can be attenuated before a desired receiver signal fRX is down converted by mixers 236 and 238, while substantially not affecting the RX frequency of the desired receiver signal fRX. Generation of the notch signal can be incorporated with the LNA 232 or be implemented after the LNA 232, such as with the circuit in FIG. 5.

Figure 5:
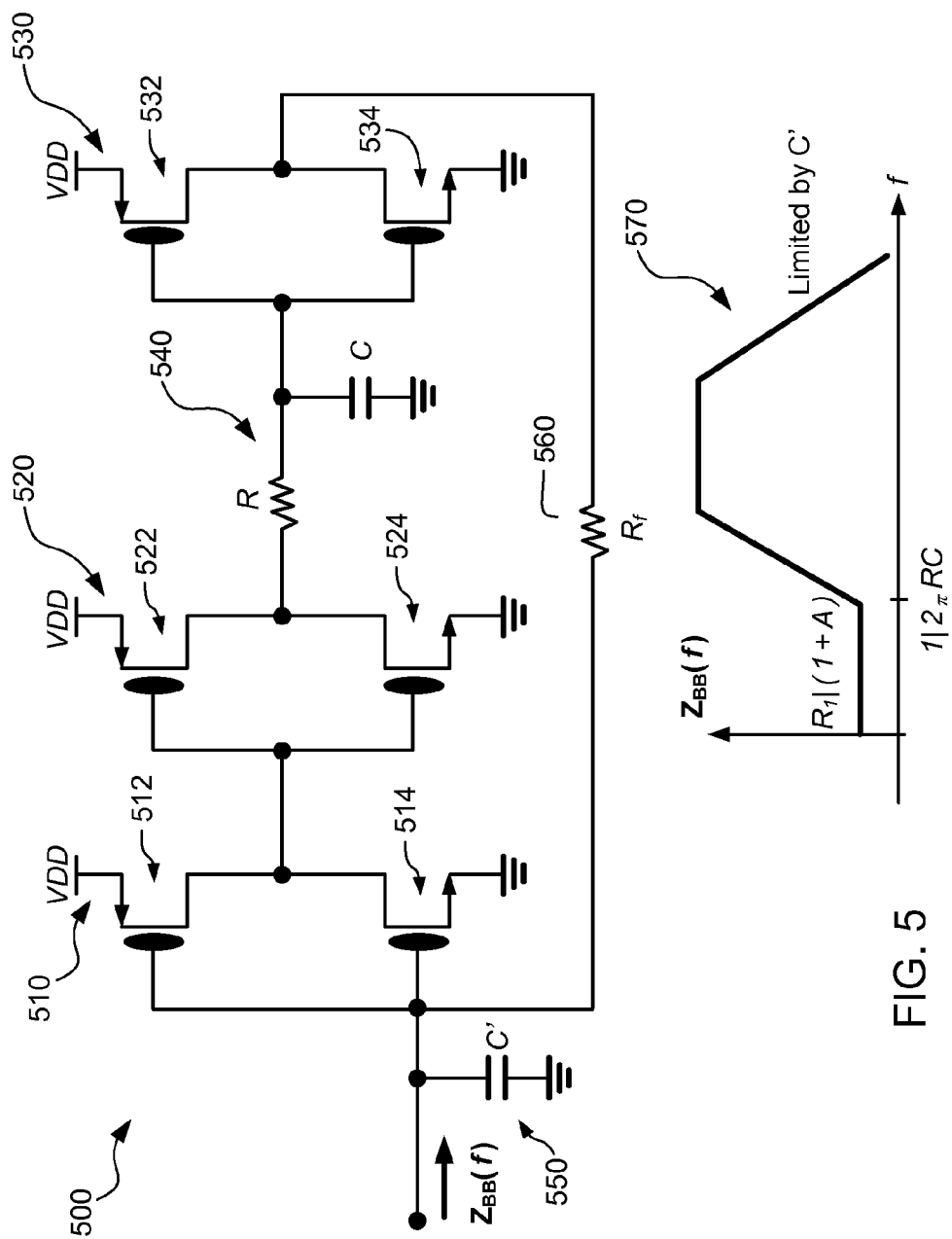
FIG. 5 is a circuit diagram of an exemplary inverter circuit to generate baseband impedance for the notch signal.

FIG. 5 is a circuit diagram of an exemplary inverter circuit 500 to generate baseband impedance ZBB(f) for generating the notch signal fTX. The inverter circuit 500 can be implemented as impedance elements ZBB(s) 410, 412, 414 and 416 in FIG. 4. The circuit 500 can include inverter 510 having switches 512 and 514, inverter 520 having switches 522 and 524, and inverter 530 having switches 532 and 534. To power the inverters 510, 520 and 530 they can be connected with supply voltage VDD. The circuit 500 can also include a resister/capacitor (RC) filter 540 connected between the inverters. Through the feedback the inverters can be biased at a desired operating point, such as VDD/2. An exemplary value for R is about 10K ohms and an exemplary value for C is about 8 pF. The circuit 500 can also include limiting capacitor C' 550, e.g., about 200 femtofarad, connected to an input of the inverter 510, and a feedback resister Rf 560 connecting the last inverter 530 to the input of the inverter 510.

At high frequencies, e.g., about 20 MHZ<f<200 MHZ, the circuit 500 can act as a band pass filter limited by capacitor C'. (E.g., diagram 570). At low frequencies, e.g., about 5 MHZ or less, the circuit 500 includes a large loop gain, e.g., about more than a thousand, and therefore a low input impedance ZBB. The input impedance ZBB(f) can be determined as the feedback resistance Rf divided by (1+A), where A is the loop gain.

For example, a feedback resister Rf of about 1 kilohm will provide about 1 ohm baseband impedance ZBB at low frequencies. At higher frequencies the baseband resistance ZBB can be large. For example, the loop gain can begin to drop at about ½πRC and the baseband impedance ZBB can begin to increase. Therefore, the circuit 500 can be configured so that at about 80 megahertz the loop gain is about zero which provides for a very high baseband impedance ZBB, such as about 500 ohms or greater. This circuit 500 can be used to generate the baseband impedance ZBB(s) of FIG. 4.

Figure 6:
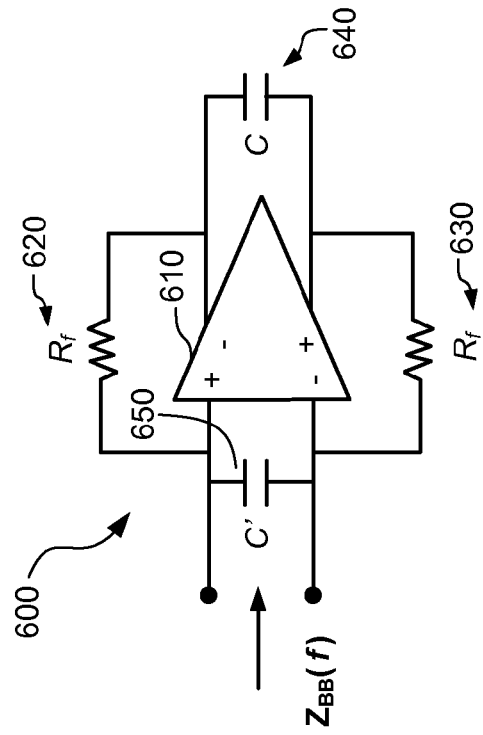
FIG. 6 is a circuit diagram of an exemplary operational amplifier circuit to generate baseband impedance.
Figure 6:
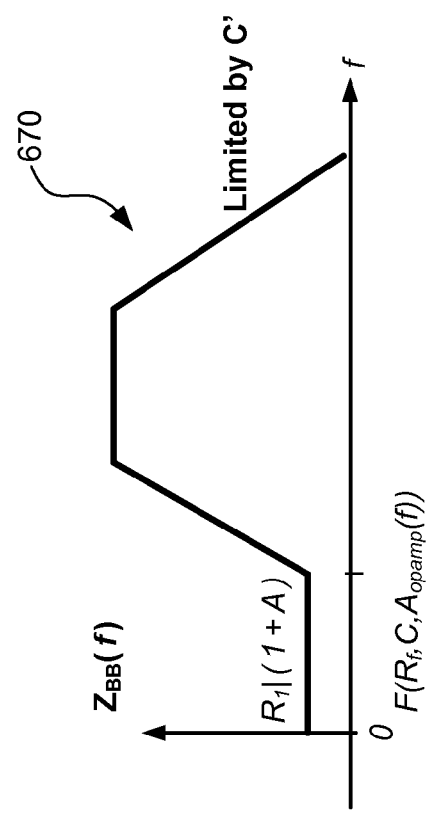

FIG. 6 is a circuit diagram of an exemplary operational amplifier (OpAmp) circuit 600 to generate baseband impedance ZBB. The circuit 600 can include an OpAmp 610, feedback resisters Rf 620 and 630, capacitor 640 and limiting capacitor C' 650.

At high frequencies, e.g., about 20 MHZ<f<200 MHZ, the circuit 600 can act as a band pass filter limited by capacitor C'. (See e.g., diagram 670). At low frequencies, e.g., about 5 MHZ or less, the circuit 600 includes a large gain, e.g., about more than a thousand, and therefore a low input impedance ZBB. The input impedance ZBB(f) is the feedback resistance Rf divided by the gain of the OpAmp (1+A). For example, a feedback resister Rf of about 1K ohm will provide about 1 ohm baseband impedance ZBB at low frequencies. At higher frequencies the baseband resistance ZBB can be large. For example, the loop gain can begin to drop at about ½πRC and the baseband impedance ZBB can begin to increase. Therefore, the circuit 600 can be configured so that at about 80 megahertz the loop gain is about zero which provides for a very high baseband impedance ZBB, such as about 500 ohms or greater. This circuit 600 can be used to generate the baseband impedance ZBB(s) of FIG. 4.

Figure 7:
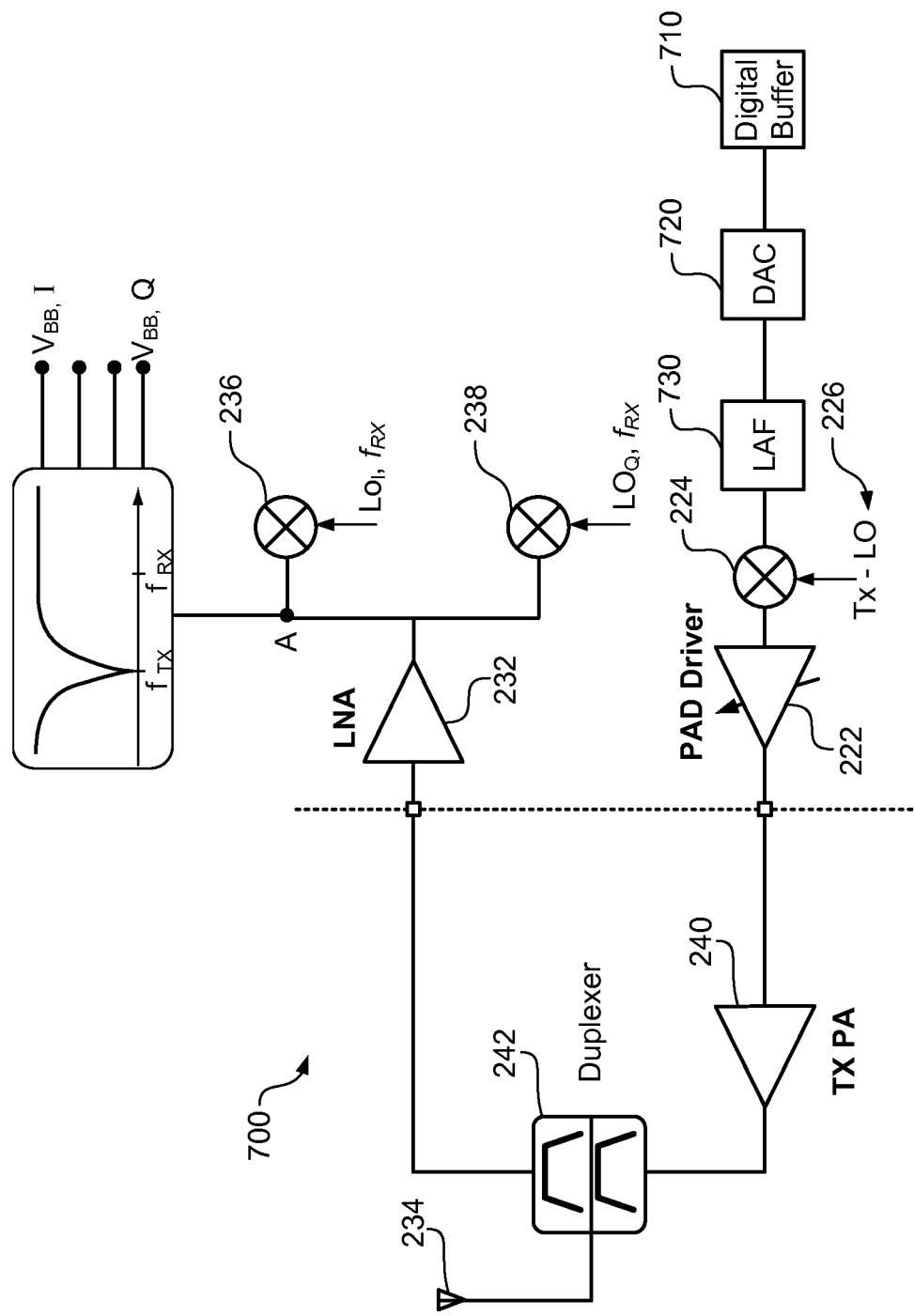
FIG. 7 is a circuit diagram of an exemplary full duplex transceiver.

FIG. 7 is a circuit diagram of an exemplary full duplex transceiver 700. The PA driver 222 can be biased in Class B instead of the Class A. Class A mode can require more power consumption than Class B mode which can have worse linearity than Class A but better power efficiency. The FDD transmissions, however, can typically require a Class A PA driver due to linearity requirements of close transmit and receive signals. To use the Class B PA driver, voltage information VBB I and VBB Q related to the baseband impedance ZBB(f) can be determined, e.g., the voltage related to VBB(f) in FIGS. 4, 5 and 6. The voltage information VBB I and VBB Q for the notch can represent the down converted TX leakage signal. Therefore, TX leakage signal distortion information can be determined from the impedance elements ZBB(s).

The voltage information VBB I and VBB Q can be determined from an error vector magnitude (EVM) and adjacent channel leakage ratio (ACLR) for the baseband side of the notch. The voltage information VBB I and VBB Q can then be digitized with an analog-to-digital converter. The digitized information can be used to determine how much the communication signal is distorted or made non-linear by the PA driver 222. The distortion information can be stored as pre-distortion information in digital buffer 710.

The pre-distortion information can be inputted to the digital-to-analog converter (DAC) 720 for pre-distorting the TX signal data stored in the DAC 720. The pre-distorted TX signal data can be sent from the DAC 720 to low pass filter 730. Since the baseband impedance information is used to determine both transmitter leakage and PA driver distortion, the baseband impedance information can be used to save power on both the transmitter and receiver ends.

Alternative and additional components may be used depending on an implementation. For example, the receiver may be used with various types of communication systems. The communication systems may include methods, devices, and logic implemented in different combinations of hardware, software or both hardware and software that utilize the receiver. For example, communication functionality may be implemented using programmed hardware or firmware elements (e.g., application specific integrated circuits (ASICs), electrically erasable programmable read-only memories (EEPROMs), controllers, microprocessors, combinations of elements, etc.), or other related components.

The functionality may be achieved using a computing apparatus that has access to a code memory which stores computer-readable program code for operation of the computing apparatus, in which case the computer-readable program code could be stored on a medium which is fixed, tangible and directly readable, (e.g., removable diskette, compact disc read only memory (CD-ROM), random access memory (RAM), dynamic random access memory (DRAM), read only memory (ROM,) fixed disk, USB drive, or other machine-readable medium such as magnetic disk or optical disk), or the computer-readable program code could be stored remotely but transmittable via a modem or other interface device (e.g., a communications adapter) connected to a network (including, without limitation, the Internet) over a transmission medium, which may be either a non-wireless medium (e.g., optical or analog communications lines) or a wireless medium (e.g., microwave, infrared or other transmission schemes) or a combination thereof.

While various embodiments of the disclosure have been described, it will be apparent that many more embodiments and implementations are possible within the scope of the disclosure. Accordingly, the disclosure is not to be restricted except in light of the attached claims and their equivalents.

What is claimed is:

1. A circuit, comprising:
   a local oscillator, the local oscillator configured to generate a transmitter local oscillator signal;
   a low noise amplifier; and
   a switch configured to be controlled by the transmitter local oscillator signal, the switch coupled to an impedance element configured to generate a notch frequency signal, the switch configured to apply the notch frequency signal to a transmitter leakage signal in a receiver signal output by the low noise amplifier to attenuate the transmitter leakage signal prior to demodulation of the receiver signal.

2. The circuit of claim 1, where the impedance element includes an inverter coupled to a resistor capacitor (RC) filter and a frequency limiting capacitor.

3. The circuit of claim 1, where the impedance element includes an operational amplifier coupled to a feedback resistor.

4. The circuit of claim 1, further comprising a transmitter path, the transmitter leakage signal imparted by the transmitter path, the transmitter path comprising:
   a buffer configured to store a pre-distortion signal; and
   a digital configured to analog converter coupled to the buffer.

5. The circuit of claim 4, where the pre-distortion signal is applied to communication information processed by the digital to analog converter to pre-distort the communication information.

6. The circuit of claim 5, where the impedance element is further configured to generate the pre-distortion signal.

7. The circuit of claim 1, where the impedance element is configured to generate the notch frequency based on I+, I−, Q+ and Q− signals generated by the local oscillator.

8. The circuit of claim 1, where the impedance element is configured to band pass filter the notch frequency signal.

9. A circuit, comprising:
   a transmitter including a transmitter mixer, the transmitter mixer to generate a modulated transmitter signal based on a local oscillator signal;
   a receiver including a receiver mixer configured to receive a transmitter leakage signal from the transmitter; and
   an impedance element including an inverter coupled to a resistor capacitor (RC) filter and a frequency limiting capacitor, the impedance element coupled to the receiver mixer, the impedance element configured to generate a notch frequency signal, the receiver mixer configured to apply the notch frequency signal to the transmitter leakage signal to attenuate the transmitter leakage signal.

10. The circuit of claim 9, where the transmitter further includes a digital to analog converter coupled to the transmitter mixer, where the digital to analog converter is configured to send a communication signal to the transmitter mixer, and where the transmitter mixer is configured to apply a pre-distortion signal to the communication signal to pre-distort the communication signal.

11. The circuit of claim 10, further including a Class 2 power amplifier driver coupled to the transmitter mixer to drive the modulated transmitter signal.

12. The circuit of claim 9, further including a low noise amplifier coupled to the receiver mixer, where the receiver mixer configured to apply the notch frequency signal to the transmitter leakage signal after the signal passes the low noise amplifier.

13. The circuit of claim 9, where the impedance element includes an operational amplifier coupled to a feedback resistor.

14. The circuit of claim 9, where the impedance element is configured to band pass filter the notch frequency signal.

15. The circuit of claim 9, where the receiver is configured to demodulate a receiver signal including the transmitter leakage signal.

16. The circuit of claim 15, where the receiver mixer is configured to apply the notch frequency signal prior to demodulation of the receiver signal.

17. A circuit, comprising:
   a digital to analog converter configured to convert an analog communication signal to a digital communication signal;
   a digital buffer coupled to the digital to analog converter, the digital buffer configured to:
     store pre-distortion information about the digital communication signal; and
     apply the pre-distortion information to the digital communication signal to generate a pre-distorted digital communication signal, the pre-distortion information being determined from an impedance element configured to generate a notch frequency signal at a transmitter leakage frequency; and a power amplifier driver configured to drive to drive the pre-distorted digital communication signal.

18. The circuit of claim 17, where the power amplifier comprises a Class B power amplifier.

19. The circuit of claim 17, where the digital buffer is configured to apply the notch frequency signal to a transmitter leakage signal to attenuate the transmitter leakage signal prior to demodulation of a desired receiver signal by a receiver.

20. The circuit of claim 17, where the impedance element includes an operational amplifier.

* * * * *